United States Patent [19]
Legros et al.

[11] 3,972,753
[45] Aug. 3, 1976

[54] METHOD FOR THE EPITAXIAL GROWTH FROM THE LIQUID PHASE

[75] Inventors: Bernard Legros; Claude Marie, both of Caen, France

[73] Assignee: U.S. Philips Corporation, New York, N.Y.

[22] Filed: Nov. 15, 1974

[21] Appl. No.: 524,315

[30] Foreign Application Priority Data
Nov. 15, 1973 France .......................... 73.40670

[52] U.S. Cl. ........................... 148/171; 148/172; 148/1.5; 252/62.3 GA; 118/415
[51] Int. Cl.² ....................................... H01L 7/38
[58] Field of Search ............... 148/171, 172, 173; 252/62.3 GA; 117/201; 118/415

[56] References Cited
UNITED STATES PATENTS

| | | | |
|---|---|---|---|
| 3,585,087 | 6/1971 | Blum et al. .................. | 148/171 |
| 3,689,330 | 9/1972 | Dosen et al. ................. | 148/171 |
| 3,854,447 | 12/1974 | Kobayashi .................... | 148/171 X |
| 3,870,575 | 3/1975 | Dosen ......................... | 148/171 |

*Primary Examiner*—G. Ozaki
*Attorney, Agent, or Firm*—Frank R. Trifari; Leon Nigohosian

[57] ABSTRACT

A method for the successive epitaxial deposition on a semiconductor substrate of a first semiconductor layer and at least one further semiconductor layer, said layers differing mutually as to at least their conductivity properties and having been obtained by crystallization from a material in the liquid phase, comprising the steps of providing at least during the whole period of the growth of said first epitaxial layer at least one dopant in a container which is present inside said space at a part thereof removed from said thermal radiation and is independent of the said crucible, said container being connected to means present outside said space for the independent movement of said container, after the growth of the first epitaxial layer arranging said container above said crucible and turning it upside down to provide to said material at least once an extra addition of said at least one dopant, and forming said further layer with said at least one dopant.

3 Claims, 3 Drawing Figures

METHOD FOR THE EPITAXIAL GROWTH FROM THE LIQUID PHASE

The present invention relates to a method for the epitaxial deposition on a semiconductor substrate at high temperature of successively, a first semiconductor layer, then at least a second semiconductor layer, the said two layers differing mutually as regards their conductivity properties and having been obtained by crystallization from a material in the liquid phase. In the method, the said substrate and the said material are placed in a crucible in contact with each other in a space which is partly exposed to the thermal radiation of a furnace with horizontal axis, in which the said material, after the formation of the said first layer, receives at least once an extra supply of at least one dopant.

It is known that the so-called method of double epitaxy from the liquid phase is preferably used together with other methods of manufacturing p-n junctions in semiconductor devices on which high requirements are imposed, for example, electroluminescent devices.

According to a general embodiment of the double epitaxy method, n and p-layers are obtained in two successive operations. The substrate, which is provided in a crucible which is to supply the liquid, sufficiently doped solution, is introduced a first time into a furnace in which it is covered with a first epitaxial layer. It is removed from the furnace, exposed to the ambient atmosphere, and then again introduced into the furnace with the same but differently doped material for depositing the second epitaxial layer.

This method with two successive operations shows two important drawbacks; on the one hand it is difficult to prevent epitaxial layer being polluted during its stay in the open air; on the other hand the interruption of the growth between the two layers facilitates the occurrence of crystal defects at the interface between said two layers.

In order to mitigate the said drawbacks, epitaxy crucibles have been proposed having two independent compartments which can selectively be made to communicate with a substrate by a set of slides which are operated from outside the furnace. The material which is destined to supply the liquid solution is distributed between the two spaces; it has an n-type doping in one compartment and a p-type doping in the other compartment. By operating the slides, the substrate is successively contacted with material which is characteristic of one conductivity type and then with the material which is doped so as to obtain the second conductivity type. If furthermore the conditions of temperature decrease of the furnace are suitable, the formation is obtained of two layers of opposite conductivity type which are present one above the other and have a p-n junction at the interface between the said two layers.

This latter method of composing a double epitaxial deposit is better than the preceding one in that sense that both layers are formed during one single stay in the furnace and are deposited in a continuous process. However, during the passage from one compartment of the crucible to the other, the first layer deposited on the substrate experiences a certain "scraping" of the surface by the liquid solutions. On the other hand and in spite of said scraping, there exists at the surface of the first layer a very fine layer of the solution of the first compartment which is introduced into the second compartment. From this follows the formation of an intermediate region between the two layers which, structurally, may be disturbed and, electrically, may be indefinite; furthermore the p-n junction is poorly localized.

An important advance consists of the formation of the two layers in one single series of operations with one liquid solution which is first doped according to a first conductivity type for determining the first layer and which receives an addition of a suitable extra impurity so as to be doped according to a second conductivity type for depositing the second layer. Furthermore, the contact between the said solutions and the substrate between the two deposition operations is not interrupted.

A crucible for processing in this manner is described in an article in "Journal of Applied Physics" Vol. 42, No. 7, July, 1972, pp. 3094 – 3097.

Said crucible is manufactured with three flat graphite plates which are placed one on top of the other and which are arranged substantially horizontally and which can be shifted mutually in their longitudinal direction. The lowermost plate or socle is provided with a cavity in the surface of the plane opposite to the intermediate plate. The substrate (in the present case of gallium arsenide) is placed in said cavity. The intermediate plate is provided with a window which, covered by the upper and lower plates, laterally bounds a volume in which the liquid solution is provided which consists of gallium, arsenic and a doping of the n-type, (e.g., zinc). The upper plate is provided with two narrow windows which are open at the top and which are closed at the base by the underlying intermediate plate. A grain of an alloy having tellurium as n-dopant is placed in one of the said two narrow windows.

After placing the above-described crucible in the furnace and adjusting the temperature in every stage of the deposition method, the intermediate plate in a first period is arranged in such a position relative to the lower plate by sliding that the window which laterally bounds the volume of liquid solution is present opposite to the cavity in which the substrate is present. The liquid solution then covers the substrate and the first epitaxial layer is deposited on said substrate, in the present example of the p-conductivity type.

After the formation of the first layer, the upper plate is made to slide over the intermediate plate without varying the mutual positions of the intermediate plate and the lower plate, so that the narrow window which surrounds the metal grain and comprises the doping becomes located above the aperture of the window which bounds the liquid volume. The said grain then drops into the solution. If the quantity of n-dopant is sufficient, the liquid solution is redoped and from that instant on a second epitaxial layer deposits of the n-conductivity type which is opposite to that of the first layer.

The embodiment for the method used for the formation of a double epitaxial deposit with a single liquid solution, which method is described in the article in "Journal of Applied Physics" and which mentioned above, exhibits a serious drawback. Since, actually, the crucible is present entirely in the zone of the furnace, the doping material which is to be supplied to the liquid solution so as to invert the conductivity type of said liquid, reaches a high temperature from the beginning of the method.

This is very annoying for certain dopants with high vapour pressure. Such impurities then spread every-where in the space in which the crucible is present, penetrate between the elements of the crucible and can change the composition of the liquid solution during the deposition of the first epitaxial layer.

This remark applies in particular to zinc which is the impurity preferably used for the formation of p-type layers in electroluminescent semiconductor devices.

Actually it is generally known that zinc is very volatile and difficult to retain in a solution used for epitaxy. When therefore zinc is used as a dopant of the p-type it is particularly difficult with the epitaxial deposition method to realize with one single liquid solution a double layer of which the second layer or surface layer is of the p-conductivity type.

The embodiment, which is recommended by the present invention, of the method of depositing thin layers by double epitaxy from the liquid phase with one single liquid solution has been studied with the aim of mitigating the above-mentioned drawbacks of the previous method in this field of technology.

The invention is based on the recognition that the experienced difficulties are mainly related to the volatile character of the dopants used; therefore said materials should be removed from the active area of the epitaxy crucible during at least a part of the epitaxial growth.

According to the invention, the method comprises the epitaxial deposition at higher temperature on a semiconductor substrate of successively a first semiconductor layer, then at least one second semiconductor layer, the said two layers differing mutually as regards their conductivity properties and having been obtained by crystallization from a material in the liquid phase. In the method the said substrate and the said material are provided in contact with each other in a crucible which has been placed in a given space which is partly exposed to the thermal radiation of a furnace having a horizontal axis, and the said material after the formation of said first layer receives at least once an extra addition of at least one dopant. At least during the whole period of the growth of the first epitaxial layer, the said dopant is provided in a container which is present within the space and, is independent of the crucible. The container is connected to means outside the said space for the independent movement and is safeguarded against the thermal radiation of the furnace. After the growth of the first epitaxial layer, the said container is arranged above the liquid phase and turned upside down causing the said dopant to drop into the liquid material in the crucible.

With the embodiment according to the invention the dopant added to the liquid solution after the formation of the first semiconductor layer can thus be retained in a closed zone of the space for the use thereof, which reduces the vapour pressure thereof in the said space, and be removed from the crucible, which obviates substantially every danger of pollution of the solution during the formation of the said first semiconductor layer.

On the other hand it is possible in this manner to store the dopant entirely until the instant of use. This latter advantage is of particular importance. Acutally, it is interesting to know the exact weight of the dopants which are added to the liquid solution. Since the loss by evaporation prior to use has been made very small, it is ensured that the weight of the added dopant corresponds substantially to that which is provided in the container at the instant of the preparation of the device. From this follows significantly a better knowledge of the degree of the doping of the second semiconductor layer which is formed from the liquid phase which has received the said dopant.

The specific advantages of the method according to the invention go hand in hand with the above-stated advantages of the method of depositing by double epitaxy with a single liquid solution, namely the use of the same liquid solution for the formation of the whole of the two layers, no danger of decomposition of the first layer for the growing of the second layer, very good crystalline coherence at the interface of the said layers and better localization of the pn-junctions in layers of different conductivity types.

The device for the epitaxial deposition which is used for the embodiment of the method according to the invention comprises, for example, a quartz glass crucible of high purity made on the model of the crucible described in French Pat. Specification No. 1,600,341 in the name of Applicants. This mode of crucible has received an extra partition which serves as a cover and which is destined to restrict the decomposition of the liquid solution by volatilization of certain components of the said solution.

The addition of the impurity, after the formation of the first layer, occurs via a tray which is secured to the end of a quartz glass rod which slides in a tube which itself is of quartz.

During the period in which the temperature of the furnace increases, the time of the stabilization and the duration of the epitaxial deposition of the first layer, the tray with the dopant is maintained at a given distance from the warm zone and from the crucible which is placed in said warm zone. At the instant at which the second layer is manufactured, the tray is allowed to slide towards the crucible and the contents of the said tray are poured into the solution.

Preferably, but not necessarily, the substrate and the liquid solution are kept in contact with each other during the whole method.

Furthermore, the crucible may be used a second time at the end of the process to add an extra quantity of dopant to the liquid solution for the formation, at the surface of the second epitaxial layer, of redoped zone which is favourable for contact connection. The device for the deposition must then contain in addition a small space which is placed in a cold zone of the space and which is designed so that same can comprise the quantity of dopant necessary for the liquid solution at the end of the process. Said small space debouches into the space opposite to the tray so that the quantity of dopant which it contains can be poured into the said tray at the suitable instant and with suitable means and can then be introduced by said tray into the liquid solution.

The invention may be used for epitaxial deposits from the liquid phase of composite semiconductor materials, in particular for depositing binary compounds and ternary compounds from columns 3 and 5 of the periodic table of elements. The invention is destined in particular for epitaxial deposits of gallium phosphide the surface layer of which is a layer of the p-conductivity type, which can be obtained by doping of zinc, for example, for the manufacture of electroluminescent devices.

The invention will be described in greater detail with reference to the accompanying drawing.

Figure 1:
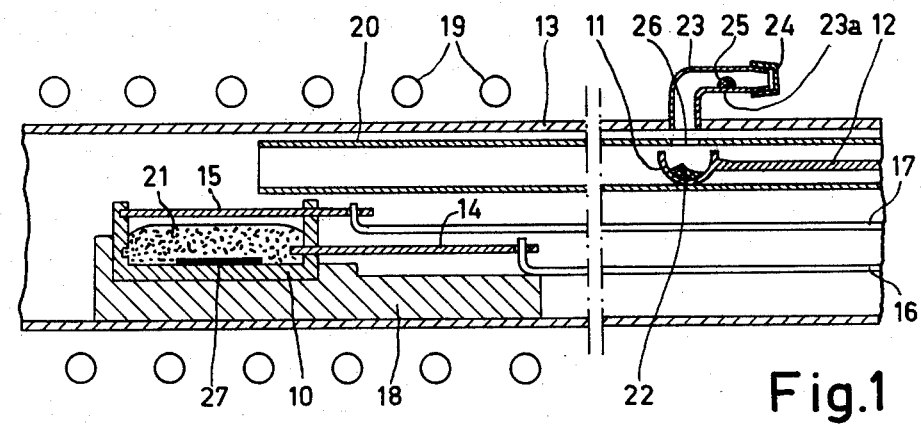
FIGS. 1 and 2 are diagrammatic longitudinal sectional views of a part of a device for carrying out the method according to the invention in two different phases for the formation of a double epitaxial layer.
Figure 2:
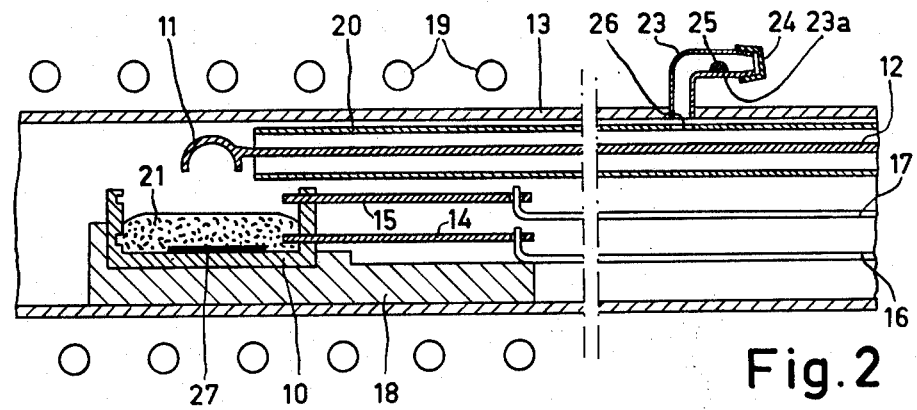

The device shown in FIGS. 1 and 2 has been restricted to the essential elements of the device for the epitaxial deposition. The part present on the left hand of the two vertical broken lines corresponds to the warm zone in which the epitaxial growth occurs, while the part on the right hand side of the same lines corresponds to a cold zone which is remote a few decimeters from the above mentioned warm zone. The device shown comprises mainly two distinct elements, a crucible 10 and a container in the form of a tray 11 which is used as an operation rod 12, which are provided in a tubular space 13. Said elements are manufactured from a very pure material which can withstand the considerable increases and changes of the temperature undetrimentally, for example, quartz.

The crucible 10 in the form of a parallelipiped comprises two movable partitions 14 and 15 which can move in a plane parallel to the bottom of the said crucible. On the bottom of the crucible one or more substrates can be deposited, for example 27, which are destined to receive an epitaxial deposit. The position of the partition 14 is such that the lower surface thereof is present very close to the upper surface of the substrates. The partition 15 is placed towards the upper side of the crucible in such manner as to form a cover.

The partitions 14 and 15 can be moved horizontally from outside the space 13 by means of quartz rods 16 and 17, respectively, which are hooked on one of the ends of the said partitions.

The crucible 10 bears on a socle 18, likwise of quartz, in a zone where it is exposed to the thermal radiation of a furnace which is shown diagrammatically by the turns 19 of a winding.

The tray 11 can slide in a guide tube 20 of quartz which at one end terminates above the crucible 10 and at the other end coincides with the cold end of the space 13.

The method of forming a double epitaxial layer according to the embodiment of the invention is as follows:

The substrate 27 is present initially on the bottom of the crucible 10. The partition 14 is inserted in crucible 10 and supports the components of the liquid solution 21. The partition 15 is also inserted into the crucible and the impurity 22 which is to be added afterwards to the liquid solution 21 is present in the tray 11. The crucible 10 is placed in the warm zone of the space, while the tray 11 is maintained in the cold zone of the furnace.

In a first phase the temperature of the crucible and of the contents thereof is increased in known manner to a given level and when the temperature is stabilized at a chosen value, the slide 15 is removed from the crucible 10 in such manner that the liquid solution 21 contacts the substrate 27 under the influence of gravity. The temperature is then reduced, during which operation the former of the two epitaxial layers is formed, the various elements of the device for the epitaxial deposition are in the positions as shown in FIG. 1.

When the first epitaxial layer has been formed, the cover 15 is removed from the crucible 10, the temperature is left to stabilize, if desired, and the operating rod 12 of the tray 11 is then moved in such manner that the said tray becomes located opposite to the crucible 10 outside the guide tube 20. The tray is then tilted and the dopant 22 drops into the liquid solution 21 by gravity (see FIG. 2).

According to a variation of the embodiment of said phase of the method, the contact between the substrate 27 and the liquid solution 21 is then interrupted before providing the dopant 22 in the said solution. For this purpose it is sufficient to draw the partition 14 into the crucible 10. The partition 15 is then again withdrawn when the dopant is provided into the liquid solution.

When the cover 15 has again been provided on the crucible 10 and the tray 11 has returned to the cold zone, a second operation for reducing the temperature begins which enables the formation of the second epitaxial layer.

When the second epitaxial layer has been formed, the slide 14 is inserted into the crucible 10 in known manner so that the liquid solution 21 is separated from the semiconductor plate which is formed by the substrate 27 and the epitaxial deposit and then the cycle for reducing the temperature is continued at such a rate that a temperature level is reached at which the space 13 can be opened and the semiconductor plate be further used. The device described for the epitaxial deposition is particularly interesting when the dopant 22 is a very volatile element, for example zinc.

In order to obtain an electroluminescent device, for example, in a gallium phosphide crystal, it is known that the layer should be a layer of the p-conductivity type which thus bears on an underlying layer of the n-conductivity type. The p-layer is preferably doped with zinc.

Figure 3:
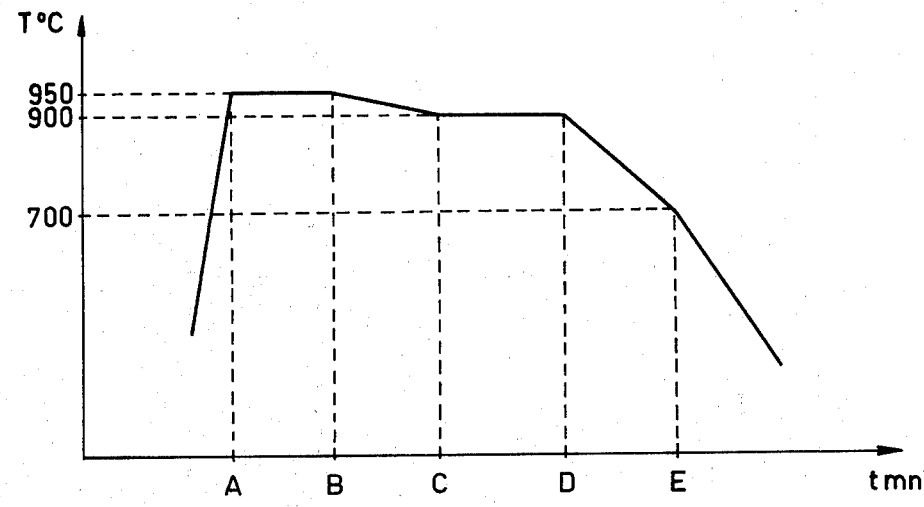
FIG. 3 is a simplified diagram which, by way of illustration, gives the value of the temperature as a function of the time during the formation of a double epitaxial layer of gallium phosfide when using the method according to the invention.

FIG. 3 shows by way of example and without limitations to the invention, the diagram of the most important phases for the formation of a double epitaxial p-n layer (the layer of the n-conductivity type is the first layer and the layer of the p-conductivity type is the second layer) of gallium phosphide according to a method of the invention.

The treatment temperatures are plotted on the vertical axis of the diagram and the times are plotted on the horizontal axis.

Until a time A the crucible and the contents thereof are heated. The time interval AB in the order of 30 minutes corresponds to a stabilization period in which the temperature is 950°C.

The phase occurring between the time interval BC is that of the growth of the first epixtaxial layer from a liquid solution of gallium and gallium phosfide, for example, doped with tellurium. During said phase the temperature decreases regularly to, for example, 900°C.

The average temperature of 900°C is maintained from C to D, for approximately epitaxial 40 mn. During said time zinc is added to the liquid solution 21 so that the conductivity type of said solution is inverted. The approach of the tray 11 and the introduction of zinc into the solution produce a slight drop in temperature which should be compensated for before the second layer can be formed.

The growth of the second epixtaxial, zinc-doped layer occurs from D to E during which time the temperature decreases regularly to approximately 700°C.

At E the liquid solution is separated from the manufactured plate and, from that instant on, the temperature drop continues in an accelerated manner, the deposition process being terminated.

In the device for the epitaxial deposition according to the invention described by means of FIGS. 1 and 2, certain measures can be taken which make it possible to proceed, if desired, to a redoping of the liquid solution. Said measures consist of the presence of a space of small dimensions present in the cold zone of the space 1, in which space the desired extra quantity of dopant is stored.

The said space may be manufactured, for example, in the form of a small quartz glass tube 23 which is welded at one of its ends to the space 13 and on which a stopper 24 can be placed.

The tube 23 is bent according to an angle slightly larger than 90° so that the part 23A of said tube is slightly inclined with respect to the axis of the space 13. In the said part 23A the extra dopant 25 is provided (for example, a grain of zinc which is introduced at the instant at which the first charge takes place). On the other hand the guide tube 20 comprises an aperture 26 which is present opposite to the entrance of the tube 23 in the space 13. In this manner the addition of dopant 25 can be transferred to the tray 11 at the suitable instant so that it is sufficient to tap gently on the tube 23 so that the dopant slides over the inclination of the part 23A of the tube and then falls into the tray 11 to be transferred by said tray to the liquid solution 21.

The operation of redoping can take place mainly at the end of the formation of the second epitaxial layer, which makes it possible to form on the surface of said second layer a redoped surface zone which is necessary for a contact connection. The corresponding operation is shown at part E of the diagram of FIG. 3. It consists simply of the supply of the dopant 25 in the tray 11, then the withdrawal of the slide 15 of the crucible 10, and again pushing the tray 11 above the crucible 10, then pouring the dopant 25 into the liquid solution and possibly again inserting the slide 15 into the crucible 10. The liquid solution is then left in contact with the semiconductor plate for the time with is necessary to form the redoped surface zone by continuing the cycle of the temperature decrease according to the segment DE shown in FIG. 3.

When the redoped surface zone has been formed, the liquid solution 21 is separated from the semiconductor plate by inserting the slide 14 into the crucible 10 and the temperature decrease is terminated at an accelerated rate as described above.

What is claimed is:

1. A method for the successive epitaxial deposition on a semiconductor substrate of a first semiconductor layer and at least one further semiconductor layer, said layers differing mutually as to at least their conductivity properties and having been obtained by crystallization from a material in the liquid phase, comprising the steps of:
    a. placing said substrate and said material in a crucible in contact with each other;
    b. disposing said crucible in a certain space which is partially exposed to the thermal radiation of a furance having a horizontal axis so as to render said material in a liquid state;
    c. forming said first layer with said material;
    d. providing at least during the whole period of the growth of said first epitaxial layer at least one dopant in a container which is present inside said space at a part thereof removed from said thermal radiation and is independent of said crucible, said container being connected to means present outside said space for the independent movement of said container;
    e. after the growth of the first epitaxial layer arranging said container above said crucible and turning it upside down to provide to said material at least once an extra addition of said at least one dopant; and
    f. forming said further layer with said at least one dopant.

2. A method as in claim 1, wherein said liquid material is isolated from said substrate before said at least one dopant is provided thereto.

3. A method as in claim 1, wherein said liquid material is left in contact with said substrate while said at least one dopant is provided in said liquid material.

* * * * *